US010256055B2

(12) United States Patent
Amano et al.

(10) Patent No.: US 10,256,055 B2
(45) Date of Patent: Apr. 9, 2019

(54) PUSH SWITCH AND ELECTRONIC DEVICE INCLUDING PUSH SWITCH

(71) Applicants: CITIZEN ELECTRONICS CO., LTD., Yamanashi-ken (JP); CITIZEN WATCH CO., LTD., Tokyo (JP)

(72) Inventors: Toyohiko Amano, Oshino-mura (JP); Satoshi Okuma, Fujiyoshida (JP); Ryo Wakuda, Kofu (JP); Ryo Itakura, Tsuru (JP); Mitsunori Miura, Fujikawaguchiko-machi (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/639,003

(22) Filed: Jun. 30, 2017

(65) Prior Publication Data

US 2018/0012712 A1 Jan. 11, 2018

Related U.S. Application Data

(60) Provisional application No. 62/360,067, filed on Jul. 8, 2016.

(51) Int. Cl.

| | |
|---|---|
| ***H01H 13/48*** | (2006.01) |
| ***H01H 13/06*** | (2006.01) |
| ***H01H 13/80*** | (2006.01) |
| *H05K 5/00* | (2006.01) |

(52) U.S. Cl.

CPC ............ *H01H 13/06* (2013.01); *H01H 13/48* (2013.01); *H01H 13/80* (2013.01); *H05K 5/0017* (2013.01)

(58) Field of Classification Search

CPC ............... H01H 13/48; H01H 11/0056; H01H 2205/026; H01H 9/342; H01H 2205/016; H01H 9/047; H01H 2215/048; H01H 2227/02; H01H 13/14; H01H 13/86; H01H 13/10; H01H 2215/044

USPC ....... 200/512, 513, 5 A, 341, 305, 406, 516, 200/515

See application file for complete search history.

(56) References Cited

U.S. PATENT DOCUMENTS

2014/0090967 A1* 4/2014 Inagaki .................. H01H 13/14 200/513
2014/0097073 A1* 4/2014 Kikuchi ................. H01H 13/14 200/512

FOREIGN PATENT DOCUMENTS

JP 1-121230 5/1989
JP 2009-76414 4/2009
JP 2014-165025 9/2014

* cited by examiner

*Primary Examiner* — Ahmed M Saeed

(74) *Attorney, Agent, or Firm* — Wenderoth, Lind & Ponack, L.L.P.

(57) ABSTRACT

In a first aspect of the present disclosure, a push switch includes a substrate including a first electrode and a second electrode arranged on an upper surface of the substrate, the second electrode arranged around the first electrode; and a resilient member that is arranged on the second electrode over the first electrode. The substrate includes a recess in a lower surface of the substrate, and the recess is positioned below the first electrode that is arranged on the upper surface of the substrate.

20 Claims, 18 Drawing Sheets

PUSH SWITCH AND ELECTRONIC DEVICE INCLUDING PUSH SWITCH

CROSS-REFERENCE TO RELATED APPLICATION

This application is a new U.S. patent application that claims benefit of U.S. provisional application No. 62/360,067 filed on Jul. 8, 2016, the disclosures of which are incorporated herein by reference in its entirety.

BACKGROUND OF THE INVENTION

Field of the Invention

The subject matter herein generally relates to a push switch, and relates to an electronic device including the push switch.

Various electronic devices include push switches, and various electronic devices may include computers, portable communication devices, wearable devices, and game consoles, for example.

Description of the Related Art

It is open to the public that a conventional push switch includes a key top including a key top body with a fringe and a pressing portion; a spring plate; a noise absorbing member that is made of a rubbery resilient member, and a case supporting the key top to be movable upward and downward. The noise absorbing member includes a pass-through portion in which the pressing portion of the key top is arranged. The noise absorbing member covers an upper surface of the spring plate to decrease a noise of the spring plate and/or a rattling noise of the key top (For reference, see Japanese Unexamined Patent Application Publication No. 2009-76414, for example).

Also, it is open to the public that a conventional push switch includes a flexible circuit substrate; and a foaming layer applied on a rear surface of the flexible circuit substrate to decrease a noise of the spring plate when the spring plate is pressed and reversed (For reference, see Japanese Unexamined Patent Application Publication No. 2014-165025, for example).

Also, as a membrane switch, it is open to the public that a push switch including a membrane switch above that a spring plate is arranged (For reference, see Japanese Utility Model Application Publication No. H1-121230).

SUMMARY OF THE INVENTION

In a first aspect of the present disclosure, a push switch includes a substrate including a first electrode and a second electrode arranged on an upper surface of the substrate, the second electrode arranged around the first electrode; and a resilient member that is arranged on the second electrode over the first electrode. The substrate includes a recess in a lower surface of the substrate, and the recess is positioned below the first electrode that is arranged on the upper surface of the substrate.

In a second aspect of the present disclosure, a push switch includes a substrate including a first electrode and a second electrode arranged on an upper surface of the substrate; and an electrically-conductive resin layer that is arranged over the first electrode and the second electrode.

DETAILED DESCRIPTION OF EMBODIMENTS

As used herein, the term “and/or” includes any and all combinations of one or more of the associated listed items.

The terminology used herein is for the purpose of describing particular embodiments only and is not intended to be limiting of the subject matter. As used herein, the singular forms “a”, “an” and “the” are intended to include the plural forms as well, unless the context clearly indicates otherwise.

As illustrated in the figures submitted herewith, some sizes of structures or portions may be exaggerated relative to other structures or portions for illustrative purposes. Relative terms such as “below” or “above” or “upper” or “lower” may be used herein to describe a relationship of one element, layer or region to another element, layer or region as illustrated in the figures. It will be understood that these terms are intended to encompass different orientations of a device in addition to the orientation depicted in the figures.

Figure 1A:
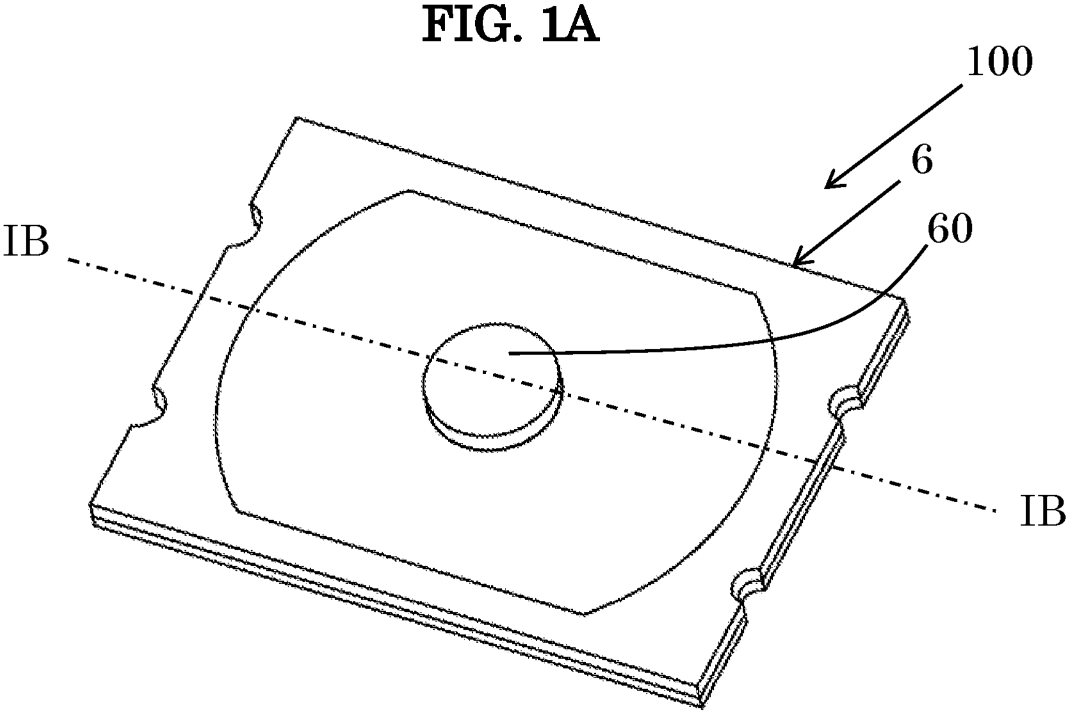
FIG. 1A shows a top perspective view of a push switch according to a first embodiment of the subject matter.

FIG. 1A shows a top perspective view of a push switch according to a first embodiment of the subject matter.

Figure 1B:
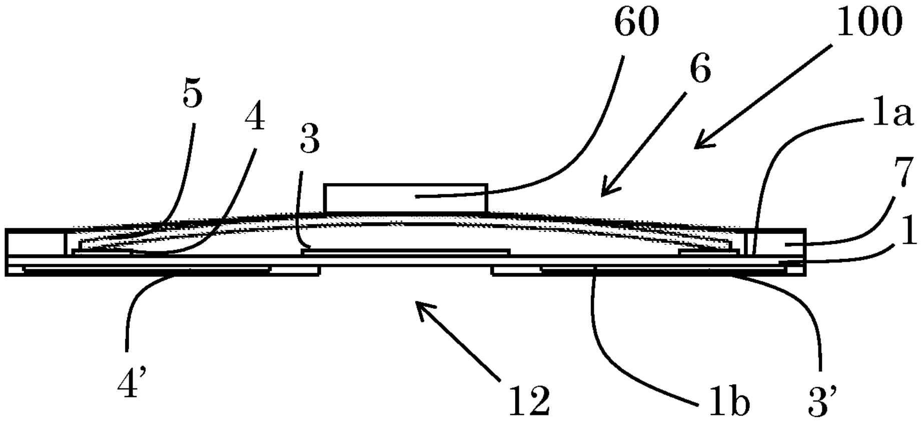
FIG. 1B shows a cross-sectional view of a push switch taken along a dotted line IB-IB shown in FIG. 1A.

FIG. 1B shows a cross-sectional view of a push switch taken along a dotted line IB-IB shown in FIG. 1A.

Figure 1C:
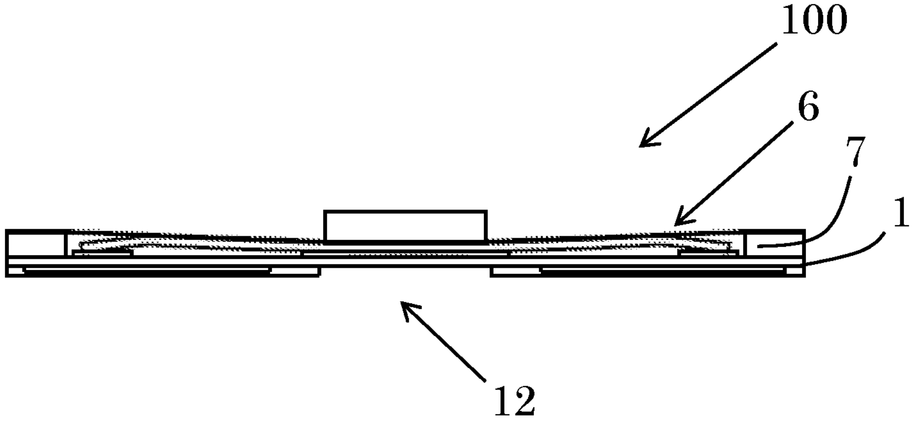
FIG. 1C shows a cross-sectional view of a push switch when a pressing force is applied from above the push switch shown in FIG. 1B.

FIG. 1C shows a cross-sectional view of a push switch when a pressing force is applied from above the push switch shown in FIG. 1B.

Figure 1D:
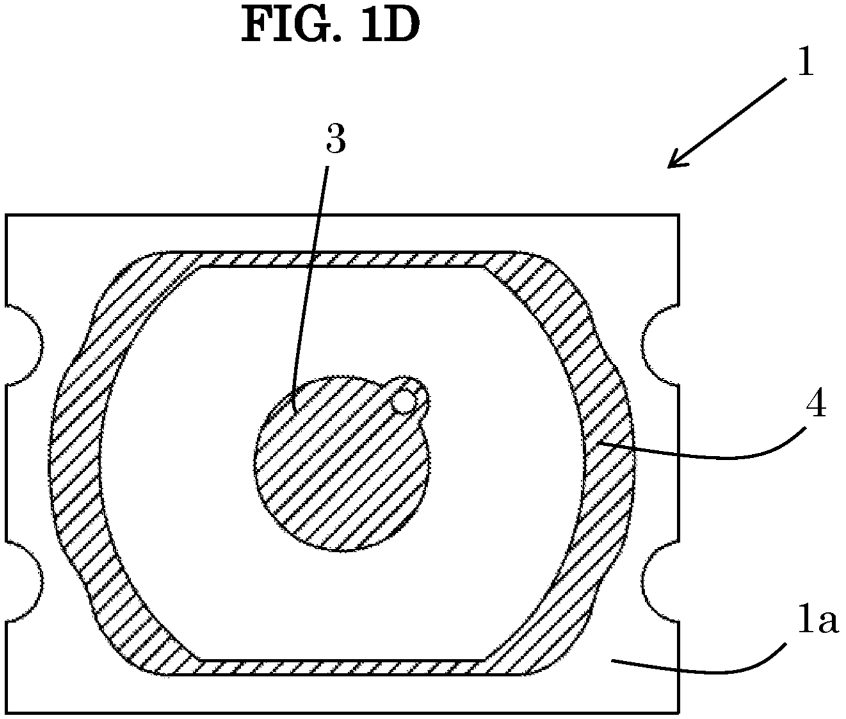
FIG. 1D shows a top plan view of a substrate of a push switch as an example, according to the first embodiment of the subject matter.

FIG. 1D shows a top plan view of a substrate of a push switch as an example, according to the first embodiment of the subject matter.

Figure 1E:
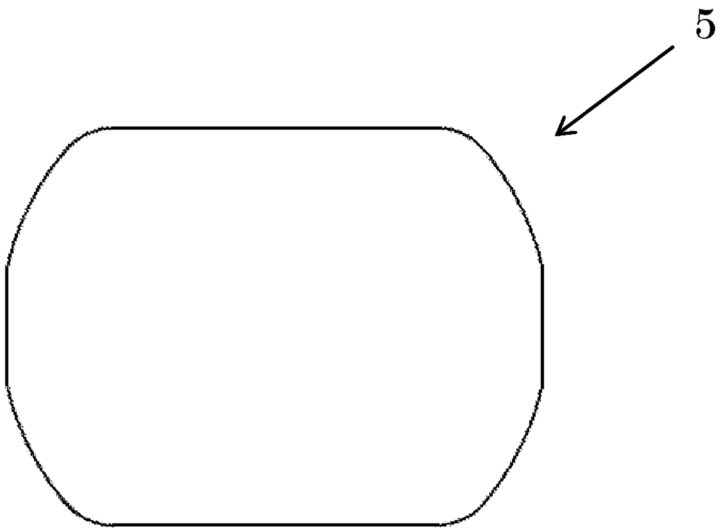
FIG. 1E shows a top plan view of a resilient member of a push switch as an example, according to the first embodiment of the subject matter.

FIG. 1E shows a top plan view of a resilient member of a push switch according to the fifth embodiment of the subject matter.

A push switch 100 includes a substrate 1. The substrate 1 includes a first electrode 3 and a second electrode 4 arranged on an upper surface 1*a* of the substrate 1. The second electrode 4 is arranged around the first electrode 3. The push switch 100 further includes a resilient member 5 that is arranged on the second electrode 4 over the first electrode 3. The substrate 1 includes a recess 12 in a lower surface 1*b* of the substrate 1. The recess 12 in a lower surface 1*b* of the substrate 1 is positioned below the first electrode 3 that is arranged on the upper surface 1*a* of the substrate 1.

Figure 1F:
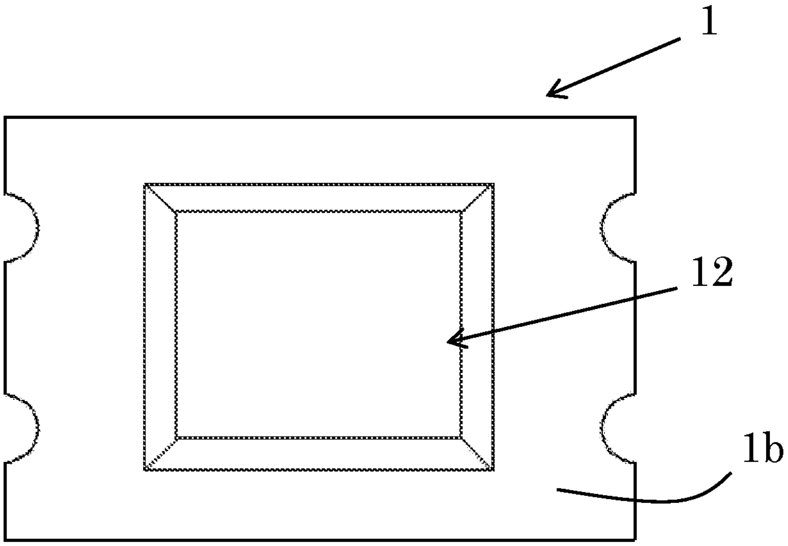
FIG. 1F shows a first example of the shape of recess arranged in a lower surface of the substrate.

FIG. 1F shows a first example of the shape of recess arranged in a lower surface of the substrate. The recess has a square shape in a plan view. Also, the recess 12 may have a rectangular shape in a plan view instead of the square shape.

It is expected that the recess 12 reduces a noise of the resilient member 5 that is a spring plate and/or a rattling noise of the push switch 100. If the size of the recess can be bigger, the noise reduction effect would be expected to be greater.

Figure 1G:
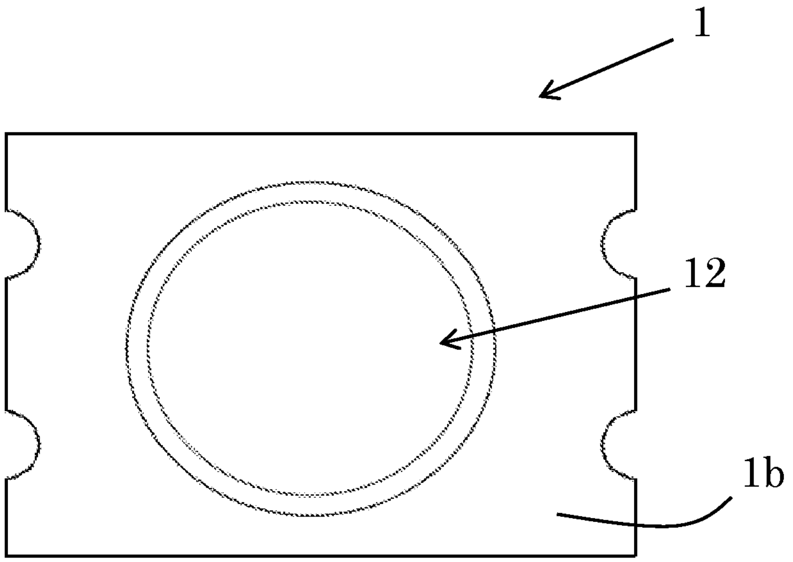
FIG. 1G shows a second example of the shape of recess arranged in a lower surface of the substrate.

FIG. 1G shows a second example of the shape of recess 12 arranged in a lower surface 1*b* of the substrate 1. The recess 12 has a circular shape in a plan view.

Figure 1H:
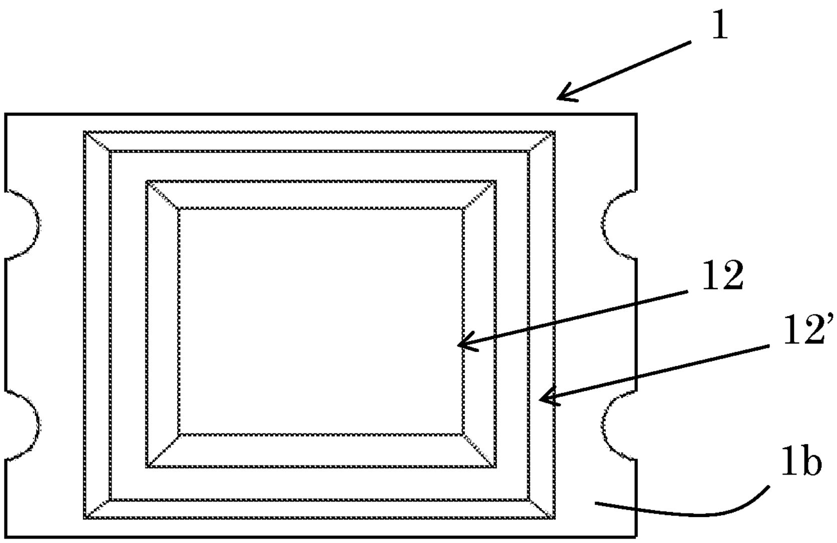
FIG. 1H shows a third example of the shape of recess arranged in a lower surface of the substrate.

FIG. 1H shows a third example of the shape of recess 12 arranged in a lower surface of the substrate. The recess may have a square shape in a plan view. Also, the substrate 1 may further include a groove 12' that is positioned in the lower surface 1*b* of the substrate 1 around the recess 12. The groove 12' may have a square outline shape that is positioned around the recess 12 in the plan view. If the size of the recess 12 can be bigger, the noise reduction effect would be expected to be greater. However, if the size of the recess 12 is bigger, strength of the substrate 1 may be decreased. Accordingly, in this embodiment, the substrate 1 includes the groove 12' around the recess 12, and thus, the strength of the substrate 1 may be maintained, while achieving a noise reduction effect.

Figure 1I:
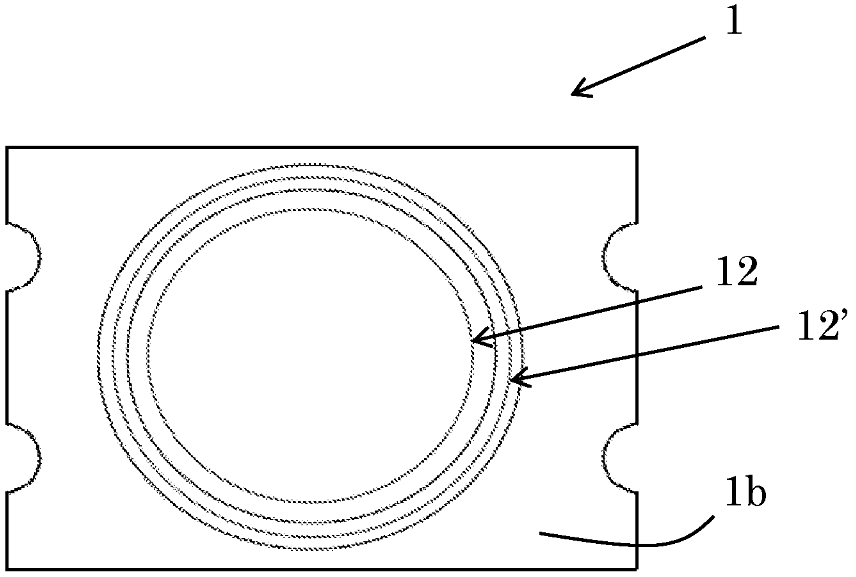
FIG. 1I shows a fourth example of the shape of recess arranged in a lower surface of the substrate.

FIG. 1I shows a fourth example of the shape of recess 12 arranged in a lower surface 1*b* of the substrate 1. The recess 12 has a circular shape in a plan view. Also, the substrate 1 may further include a groove 12' that has an annular shape and positioned around the recess 12 in the plan view as shown in FIG. 1I.

In FIG. 1F-1H, electrodes arranged in the lower surface 1*b* of the substrate 1 are not shown, because an arrangement and or a design of an electrode are freely selected. However, there may be a first lower electrode 3' that is electrically connected to the first electrode 3 arranged on the upper surface 1*a* of the substrate 1. The first electrode 3 may be electrically connected to the first lower electrode 3' by a through-hole that may pass through the substrate 1 from the upper surface 1*a* to the lower surface 1*b* of the substrate 1, for example. Also, there may be a second lower electrode 4' that is electrically connected to the second electrode 4 arranged on the upper surface 1*a* of the substrate 1. The second electrode 4 may be electrically connected to the second lower electrode 4' by a through-hole that may pass through the substrate 1 from the upper surface 1*a* to the lower surface 1*b* of the substrate 1, for example.

As shown in FIG. 1D, The second electrode 4 may surround the first electrode 3. The second electrode 4 may be annular shaped, for example. The term “annular shaped” herein includes circular-ring shaped, elongated ring shaped, and ring shaped including a straight line and a curved line. The second electrode 4 may be annular shaped with a cut portion.

The term “substrate” may include a resin body and/or a resin case that may include metal leads.

The substrate 1 may include through-holes 33 provided at a side of the substrate 1 or provided to pass through the substrate 1 from the upper surface 1*a* to the lower surface 1*b* of the substrate 1. The electrode arranged on the lower surface 1*b* of the substrate 1 may be used when the push switch 100 is electrically mounted on a motherboard of an electronic device.

The push switch 100 further includes a resilient member 5 that is arranged on the second electrode 4 over the first electrode 3 and the through-hole 2 of the substrate 1.

The resilient member 5 is arranged on the second electrode 4 at a peripheral portion 5*c* of the resilient member 5. The resilient member 5 in this embodiment may be a plate spring made of metal.

When a push switch is pressed down, a resilient member 5 that is made of metal collides with a first electrode 3 of a substrate and tends to cause a collision noise. However, if the substrate 1 includes a recess 12 that is positioned in the lower surface 1*b* of the substrate 1 under the first electrode 3, such a collision noise caused by a collision of the resilient member 5 made of metal and the first electrode 3 of the substrate 1 may be diminished. For more details, the resilient member 5 includes a dome shape that bulges at a center of the resilient member 5. The recess 12 in the lower surface 1*b* of the substrate 1 has a center that is aligned with the center of the dome shape of the resilient member in a plan view.

The push switch 100 further includes a sheet 6 arranged over the resilient member 5 that is arranged on the second electrode 4 over the first electrode 3.

The sheet 6 may include a projection 60 arranged on a surface of the sheet 6. The projection 60 may be integrally formed on the surface of the sheet 6. Also, the projection 60 may be adhered to the surface of the sheet 6.

The push switch 100 may further include an adhesive layer 7 arranged on the upper surface 1*a* of the substrate 1 around the second electrode 4. The sheet 6 includes a peripheral portion 6*c* that is adhered by the adhesive layer 7 to the upper surface 1*a* of the substrate 1.

The adhesive layer 7 may be an adhesive sheet. The adhesive sheet may have an annular shape. The term "annular shape" herein includes a circular ring shape, an elongated ring shape, and a ring shape including a straight line and a curved line.

Figure 2A:
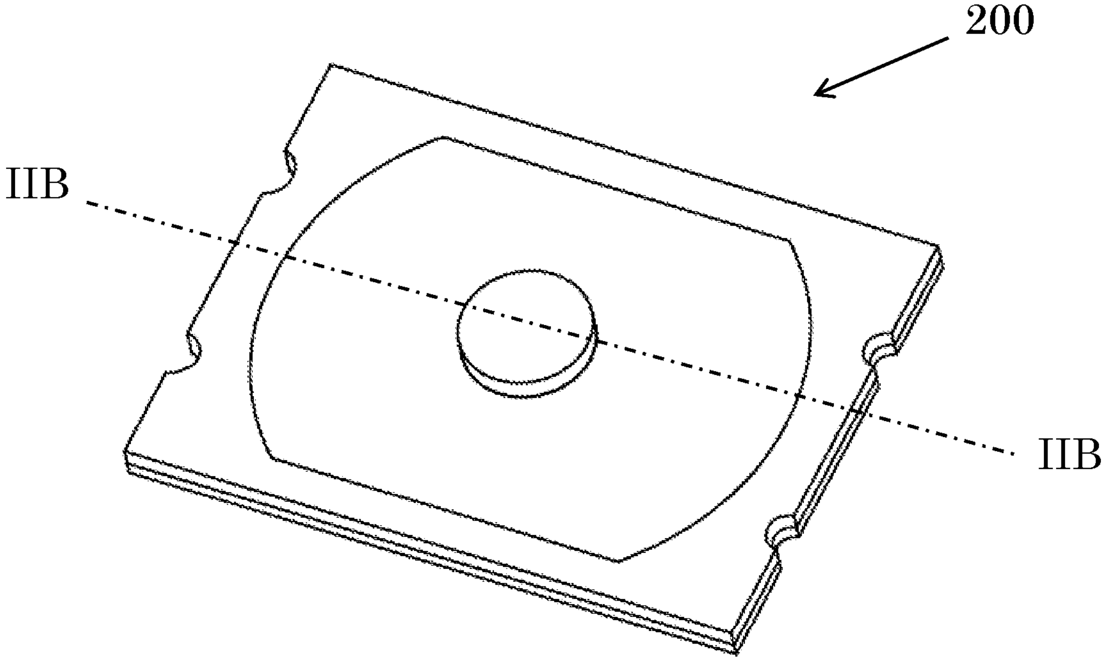
FIG. 2A shows a top perspective view of a push switch according to a second embodiment of the subject matter.

FIG. 2A shows a top perspective view of a push switch according to a second embodiment of the subject matter.

Figure 2B:
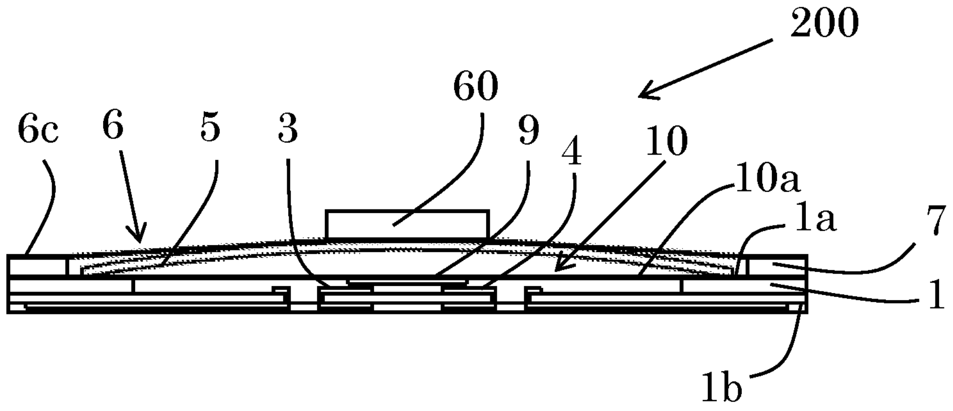
FIG. 2B shows a cross-sectional view of a push switch taken along a dotted line IIB-IIB shown in FIG. 2A.

FIG. 2B shows a cross-sectional view of a push switch taken along a dotted line IIB-IIB shown in FIG. 2A.

Figure 2C:
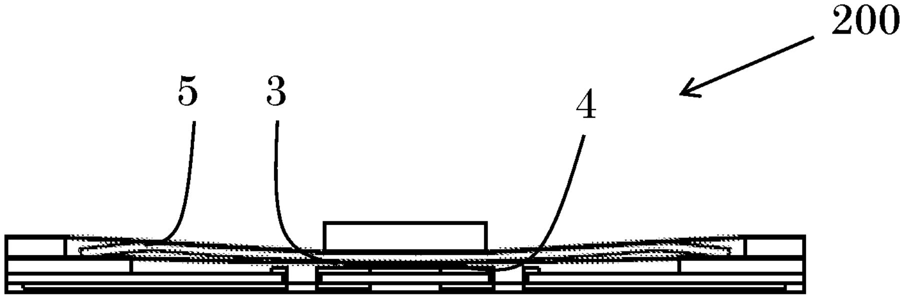
FIG. 2C shows a cross-sectional view of a push switch when a pressing force is applied from above the push switch shown in FIG. 2B.

FIG. 2C shows a cross-sectional view of a push switch when a pressing force is applied from above the switch shown in FIG. 2B.

Figure 2D:
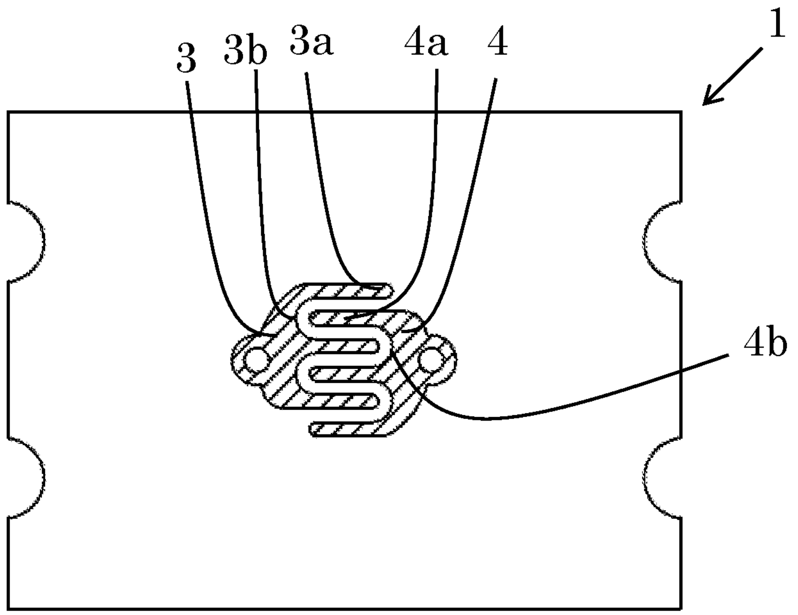
FIG. 2D shows a top plan view of a substrate of a push switch as an example, according to the second embodiment of the subject matter.

FIG. 2D shows a top plan view of a substrate of a push switch according to the second embodiment of the subject matter.

Figure 2E:
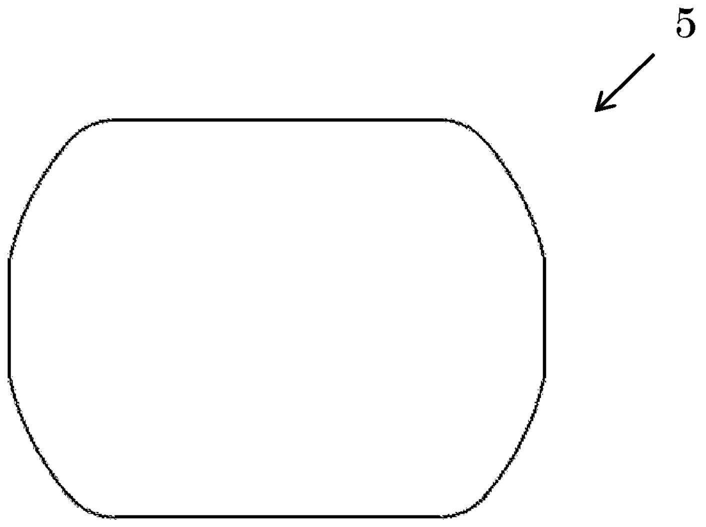
FIG. 2E shows a top plan view of a resilient member of a push switch as an example, according to the third embodiment of the subject matter.

FIG. 2E shows a top plan view of a resilient member of a push switch as an example, according to the second embodiment of the subject matter.

A push switch 200 includes a substrate 1 that includes a first electrode 3 and a second electrode 4 arranged on an upper surface 1*a* of the substrate 1.

The push switch 200 further includes an electrically-conductive resin layer 9 that is arranged over the first electrode 3 and the second electrode 4.

The push switch 200 may further include a sheet 10 including an upper surface 10*a* and a lower surface 10*b* on that the electrically-conductive resin layer 9 is arranged. The electrically-conductive resin layer 9 may be printed on the lower surface 10*b* of the sheet 10. The push switch 200 further includes a resilient member 5 that is arranged above the electrically-conductive resin layer 9. The push switch 200 includes a resilient member 5 that is arranged over the upper surface 10*a* of the sheet 10. The first electrode 3 and the second electrode 4 of the push switch 200 are arranged to face each other with a gap between the first electrode 3 and the second electrode 4.

The first electrode 3 and the second electrode 4 are positioned in a central portion of the upper surface 1*a* of the substrate 1. When viewed from above, the first electrode 3 includes a projecting portion 3*a* toward the second electrode 4 and a recess 3*b* adjacent to the projecting portion 3*a*. The second electrode 4 includes a projecting portion 4*a* toward the first electrode 3 and a recess 4*b* adjacent to the projecting portion 4*a*. The projecting portion 3*a* of the first electrode 3 may be arranged in the recess 4*b* of the second electrode 4. The projecting portion 4*a* of the second electrode 4 may be arranged in the recess 3*b* of the first electrode 3 on the substrate 1. When the push switch 200 is pressed from above, the first electrode 3 and the second electrode 4 is electrically connected by the electrically-conductive resin layer 9 that is arranged over the first electrode 3 and the second electrode 4 to be in contact with the first electrode 3 and the second electrode 4 of the substrate 1.

When a push switch is pressed down from above, a resilient member made of metal, which collides with an electrode of a substrate, tends to cause a collision noise. However, in this embodiment, since the sheet 10 is arranged between the substrate 1 and the resilient member 5, the collision noise caused by resilient member 5 and the substrate 1 may be diminished.

For more details, a push switch 200 includes a substrate 1 including a first electrode 3 and a second electrode 4 that are arranged on an upper surface 1*a* of the substrate 1. The push switch 200 further includes a first sheet 10 that includes an upper surface 10*a* and a lower surface 10*b* that is arranged over the upper surface 1*a* of the substrate 1. The push switch 200 further includes an electrically-conductive resin layer 9 that is arranged on the lower surface 10*b* of the first sheet 10 over the first electrode 3 and the second electrode 4 of the substrate 1. The push switch 200 further includes a resilient member 5 that is arranged over the first sheet 10. The resilient member 5 includes a dome shape that is positioned above the first electrode 3 and the second electrode 4 of the substrate 1. In this embodiment, the resilient member 5 does not form an electrical connection between the first electrode 3 and the second electrode 4 of the substrate 1 but the electrically-conductive resin layer 9 electrically connects the first electrode 3 and the second electrode 4 of the substrate 1, when the push switch 200 is pressed down from above.

Figure 3A:
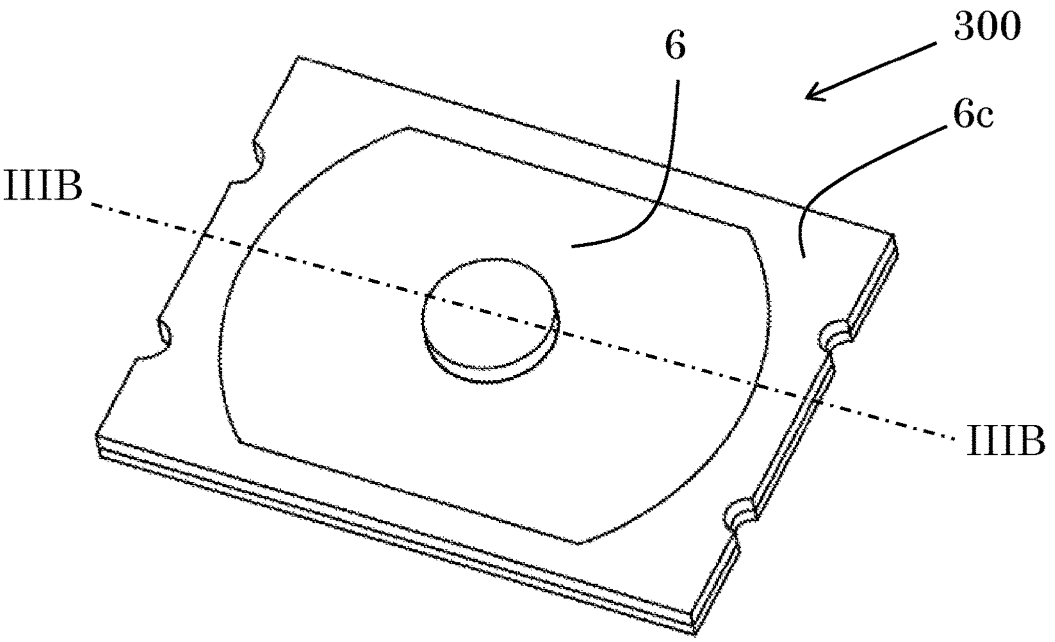
FIG. 3A shows a top perspective view of a push switch according to a third embodiment of the subject matter.

FIG. 3A shows a top perspective view of a push switch according to a third embodiment of the subject matter.

Figure 3B:
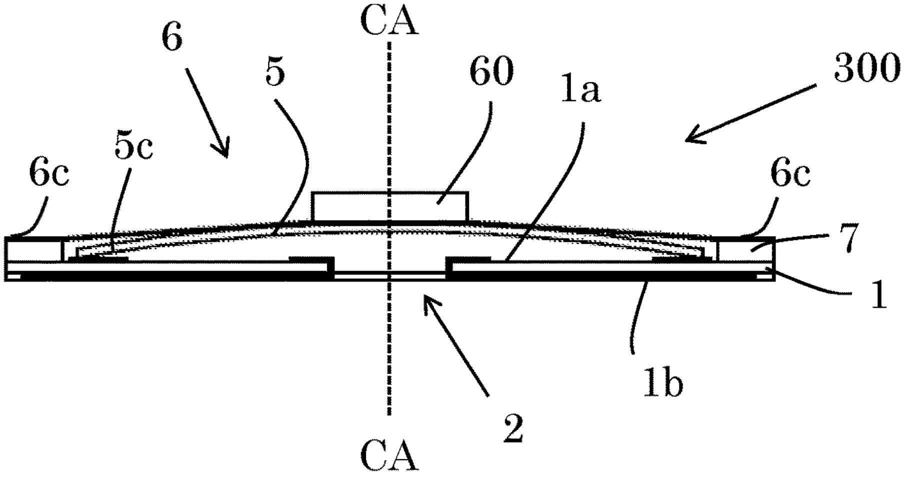
FIG. 3B shows a cross-sectional view of a push switch taken along a dotted line IIIB-IIIB shown in FIG. 3A.
Figure 3C:
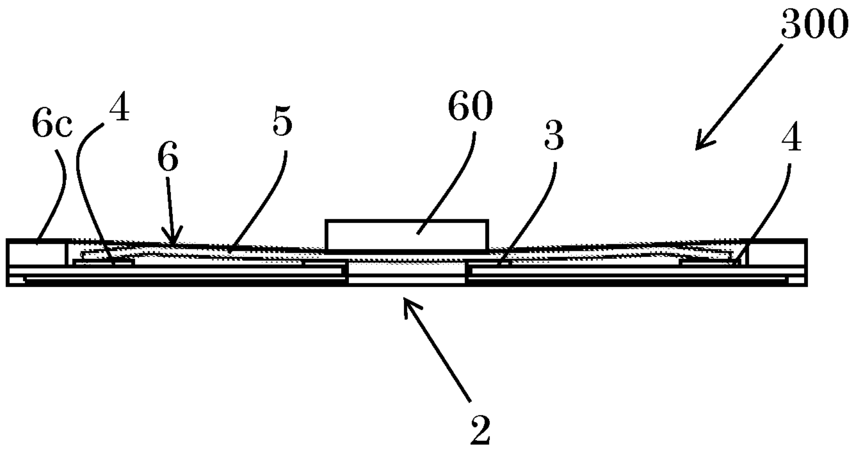
FIG. 3C shows a cross-sectional view of a push switch when a pressing force is applied from above the push switch shown in FIG. 3B.

FIG. 3B shows a cross-sectional view of a push switch taken along a dotted line IIIB-IIIB shown in FIG. 3A. FIG. 3C shows a cross-sectional view of a push switch when a pressing force is applied from above the switch shown in FIG. 3B. A push switch 300 includes a substrate 1. The substrate 1 includes a through-hole 2 that passes through the substrate 1 from an upper surface 1*a* to a lower surface 1*b* of the substrate 1. The substrate 1 includes a first electrode 3 arranged on the upper surface 1*a* of the substrate 1 adjacent to the through-hole 2. The substrate 1 includes a second electrode 4 arranged on the upper surface 1*a* of the substrate 1 around the first electrode 3 and the through-hole 2.

Figure 3D:
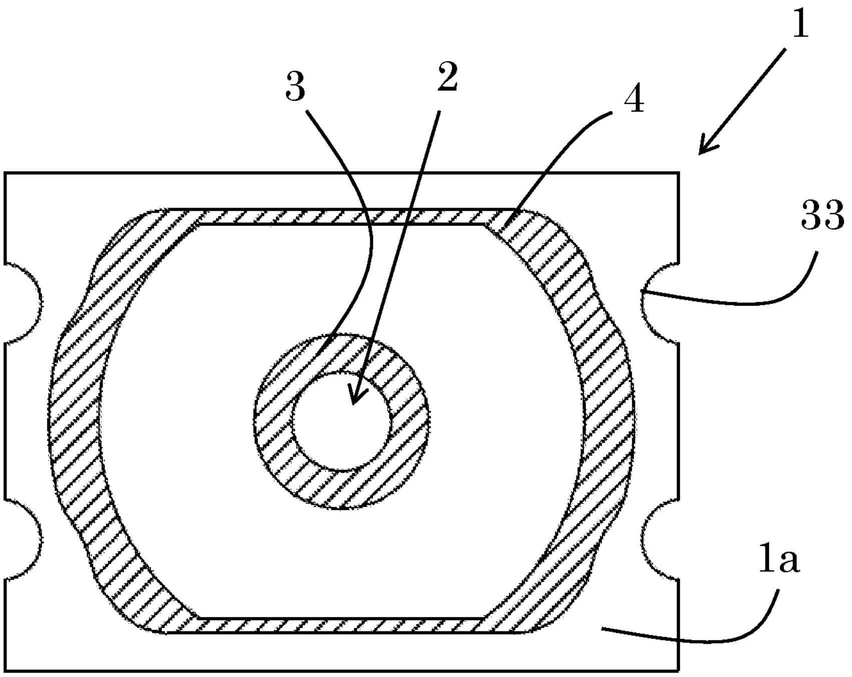
FIG. 3D shows a top plan view of a substrate of a push switch as an example, according to the third embodiment of the subject matter.

The second electrode 4 may surround the first electrode 3 as shown in FIG. 3D. The second electrode 4 may be annular shaped, for example. The term "annular shaped" herein includes circular-ring shaped, elongated ring shaped, and ring shaped including a straight line and a curved line. The second electrode 4 may be annular shaped with a cut portion.

The term "substrate" may include a resin body and/or a resin case including metal leads.

The substrate 1 may include through-holes provided at a side of the substrate 1. The through-holes at the side of the substrate 1 may be used when the push switch is electrically mounted on a motherboard of an electronic device. Accordingly, the second electrode 4 may be electrically connected to a through hole 33 that may be provided at the side of the substrate 1. Also, the first electrode 3 may be electrically connected to a through hole that is provided at the side of the substrate 1 or provided to pass through the substrate 1 from the upper surface 1*a* to the lower surface 1*b* of the substrate 1.

The push switch 300 further includes a resilient member 5 that is arranged on the second electrode 4 over the first electrode 3 and the through-hole 2 of the substrate 1.

The resilient member 5 is arranged on the second electrode 4 at a peripheral portion 5*c* of the resilient member 5. The resilient member 5 in this embodiment may be a plate spring made of metal.

When a push switch is pressed down, a resilient member that is made of metal collides with a first electrode of a substrate and tends to cause a collision noise. However, if the substrate 1 includes a through-hole that is positioned adjacent to the first electrode, such a collision noise caused by a collision of the resilient member made of metal and the first electrode of the substrate may be diminished.

The push switch 300 further includes a sheet 6 arranged over the resilient member 5 that is arranged on the second electrode 4 over the first electrode 3.

The sheet 6 may be a resin sheet. Also, the sheet 6 may be a polyimide sheet, for example. The sheet 6 may be a waterproof sheet. If a projection 60 is arranged on or above the sheet 6, a pressing force will be applied on the projection 60, which may be positioned on a central axis CA of the push switch. The projection 60 may be adhered to the sheet 6, for example.

The push switch 100 may further include an adhesive layer 7 arranged on the upper surface 1*a* of the substrate 1 around the second electrode 4. The sheet 6 includes a peripheral portion 6*c* that is adhered by the adhesive layer 7 to the upper surface 1*a* of the substrate 1.

The adhesive layer 7 may be an adhesive sheet. The adhesive sheet may have an annular shape.

The term "annular shape" herein includes a circular ring shape, an elongated ring shape, and a ring shape including a straight line and a curved line.

In this embodiment, the resilient member 5 includes a metal. The resilient member 5 may include a dome shape facing the first electrode 3 and the through-hole 2 that passes through the substrate 1.

For more details, the resilient member 5 includes a dome shape facing the first electrode 3 that surrounds the through-hole 2 passing through the substrate 1. In this embodiment, the through-hole of the substrate 1 may have a diameter in a range of 0.5 mm to 1.5 mm, which is larger than an ordinary through-hole with a diameter of 0.3 mm or less, for example.

The adhesive layer 7 may be an adhesive sheet. The adhesive sheet may have an annular shape. The term "annular shape" here includes a circular ring shape, an elongated ring shape, and a ring shape including a straight line and a curved line. The first electrode 3 may be electrically connected to the through-hole 2. Also, the first electrode 3 may be electrically connected to a lower electrode that is arranged on a lower surface 1*b* of the substrate 1.

FIG. 3D shows a top plan view of a substrate of a push switch according to the first embodiment of the subject matter.

Figure 3E:
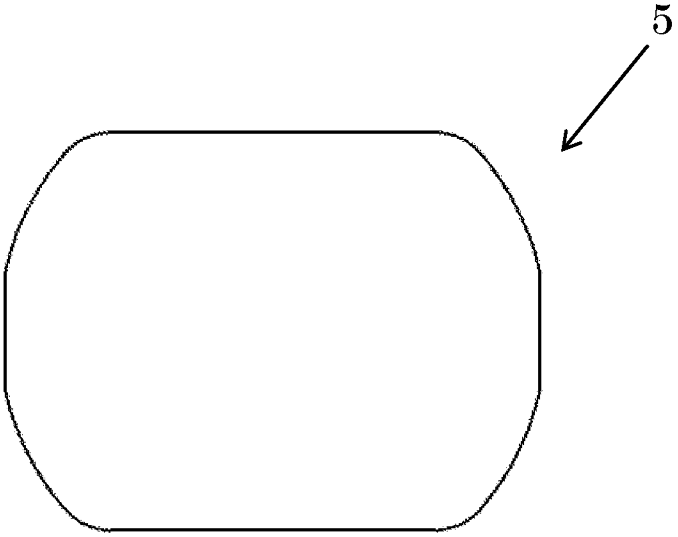
FIG. 3E shows a top plan view of a resilient member of a push switch as an example, according to the third embodiment of the subject matter.

FIG. 3E shows a top plan view of a resilient member of a push switch as an example, according to the third embodiment of the subject matter.

Figure 4A:
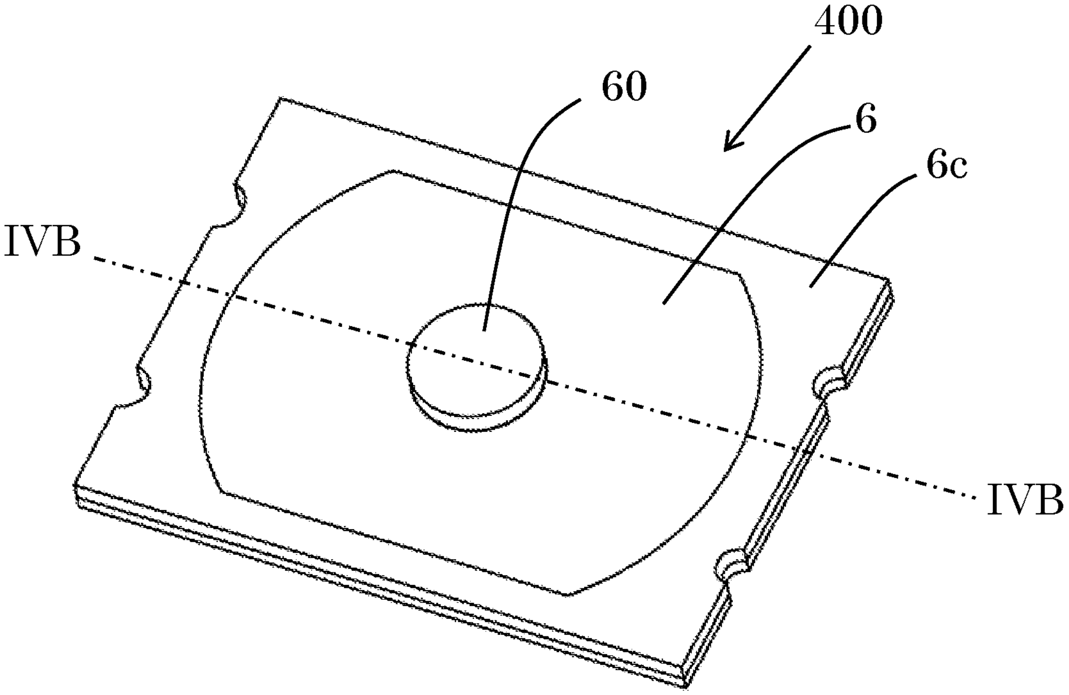
FIG. 4A shows a top perspective view of a push switch according to a fourth embodiment of the subject matter.

FIG. 4A shows a top perspective view of a push switch according to a fourth embodiment of the subject matter.

Figure 4B:
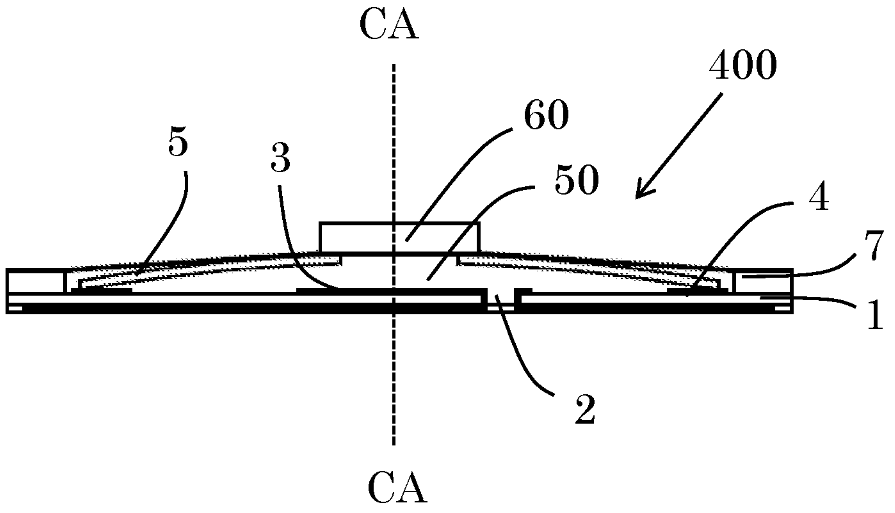
FIG. 4B shows a cross-sectional view of a push switch taken along a dotted line IVB-IVB shown in FIG. 4A.

FIG. 4B shows a cross-sectional view of a push switch taken along a dotted line IIB-IIB shown in FIG. 4A.

Figure 4C:
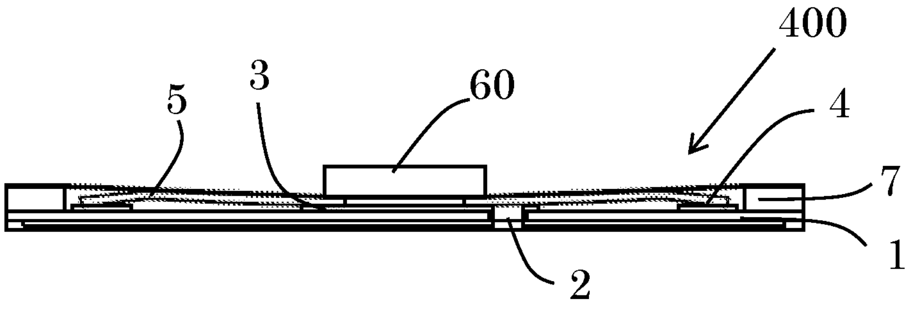
FIG. 4C shows a cross-sectional view of a push switch when a pressing force is applied from above the push switch shown in FIG. 4B.

FIG. 4C shows a cross-sectional view of a push switch when a pressing force is applied from above the switch shown in FIG. 4B.

Figure 4D:
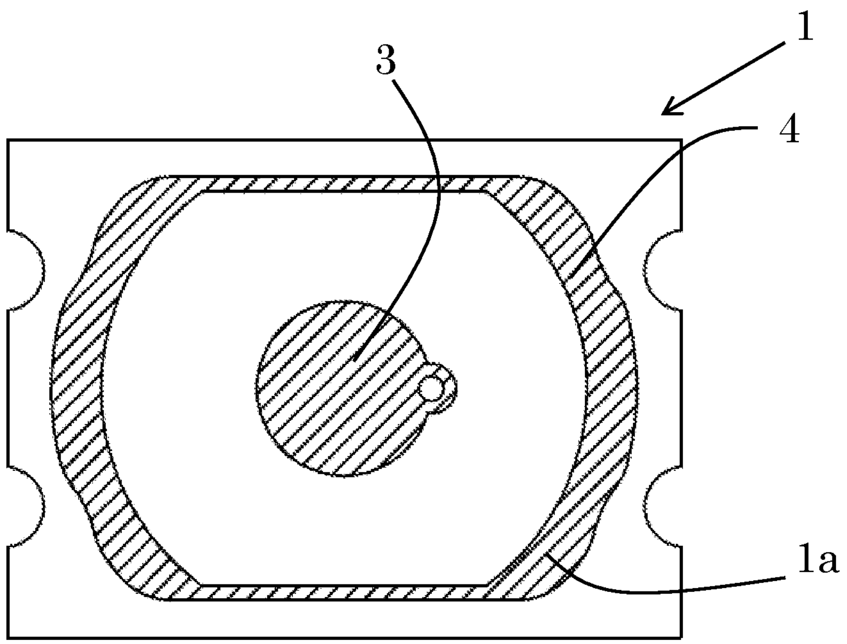
FIG. 4D shows a top plan view of a substrate of a push switch as an example, according to the fourth embodiment of the subject matter.

FIG. 4D shows a top plan view of a substrate of a push switch as an example, according to the fourth embodiment of the subject matter.

Figure 4E:
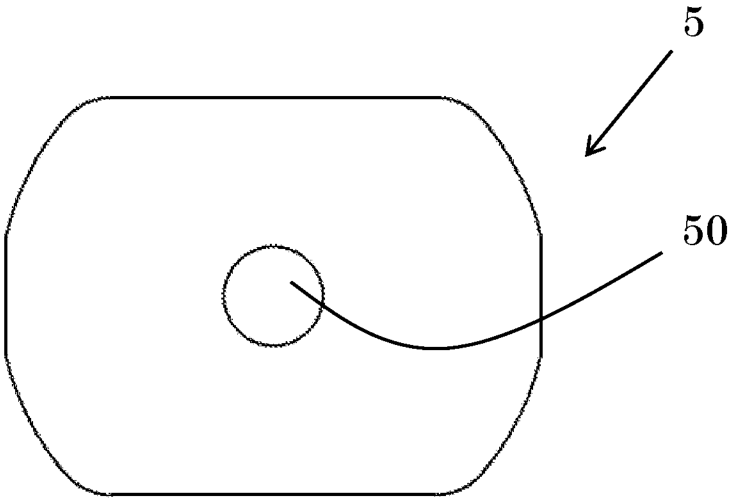
FIG. 4E shows a top plan view of a resilient member of a push switch as an example, according to the fourth embodiment of the subject matter.

FIG. 4E shows a top plan view of a resilient member of a push switch as an example, according to the fourth embodiment of the subject matter.

A push switch 400 includes a substrate 1. The substrate 1 of the push switch 400 includes a through-hole 2 passing through the substrate 1 from an upper surface 1*a* to a lower surface 1*b*. The substrate 1 of the push switch 400 further includes a first electrode 3 arranged on the upper surface 1*a* adjacent to the through-hole 2, and a second electrode 4 arranged on the upper surface 1*a* of the substrate 1 around the first electrode 3 and the through-hole 2.

The push switch 400 further includes a resilient member 5 that is arranged on the second electrode 4 over the first electrode 3. The resilient member 5 includes a hole 50 that is positioned at a center of the resilient member 5.

The resilient member 5 of the push switch 400 includes a dome shape that faces the first electrode 3, and the through-hole 2 of the substrate 1. In this embodiment, the through-hole 2 may be positioned adjacent to a peripheral portion of the first electrode 3.

In this embodiment, the hole 50 of the resilient member 5 is aligned on a central axis CA of the switch 400. The central axis CA passes through the center of the resilient member 5. As shown in FIG. 4B and FIG. 4C, the through-hole 2 that passes through the substrate 1 is not aligned on the central axis CA.

For more details, the hole 50 of the resilient member 5 may be positioned at a center of the dome shape. The hole 50 may have a diameter in a range of 0.3 mm to 3 mm.

When a push switch is pressed down, a resilient member made of metal collides with a first electrode of a substrate and causes a collision noise. If the resilient member 5 includes a hole 50 that is positioned at a center of the dome shape, the resilient member 5 around the hole 50 annularly collides with the first electrode. Accordingly, the collision noise caused by the resilient member 5 around the hole 5 with the first electrode may be diminished.

Figure 5A:
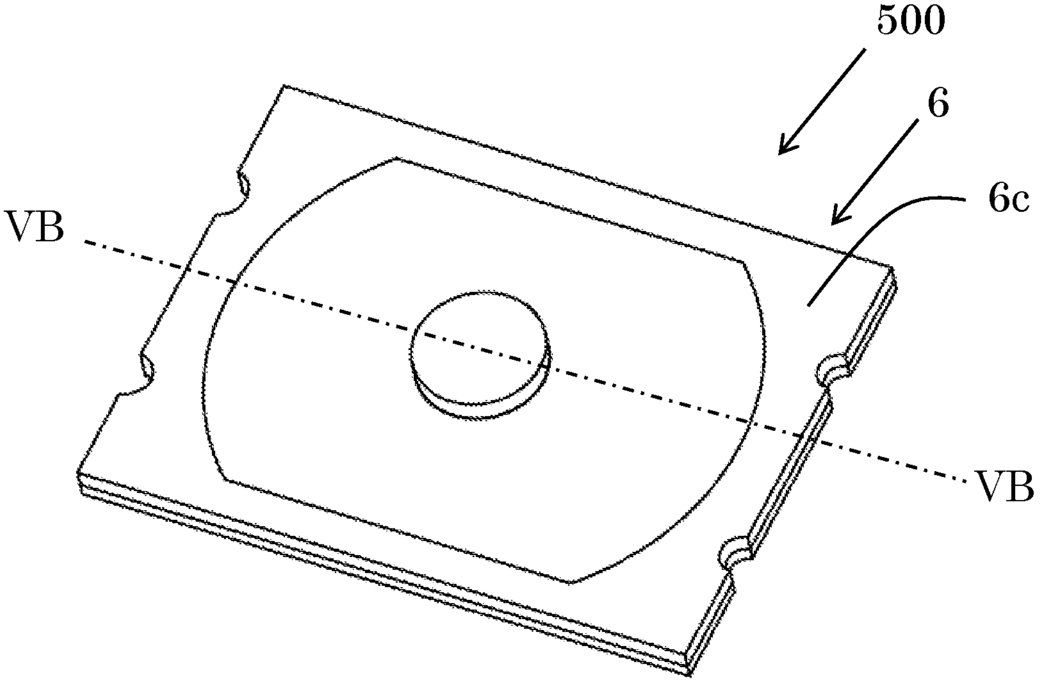
FIG. 5A shows a top perspective view of a push switch according to a fifth embodiment of the subject matter.

FIG. 5A shows a top perspective view of a push switch according to a fifth embodiment of the subject matter.

Figure 5B:
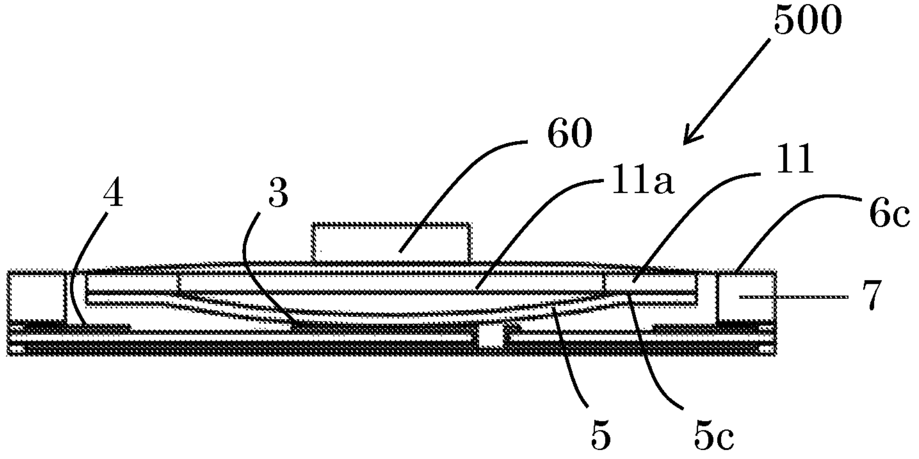
FIG. 5B shows a cross-sectional view of a push switch taken along a dotted line VB-VB shown in FIG. 5A.

FIG. 5B shows a cross-sectional view of a push switch taken along a dotted line VB-VB shown in FIG. 5A.

Figure 5C:
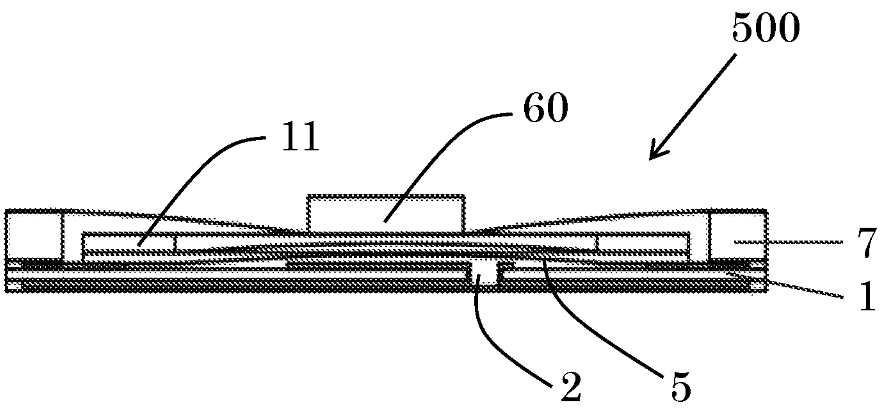
FIG. 5C shows a cross-sectional view of a push switch when a pressing force is applied from above the push switch shown in FIG. 5B.

FIG. 5C shows a cross-sectional view of a push switch when a pressing force is applied from above the switch shown in FIG. 5B.

Figure 5D:
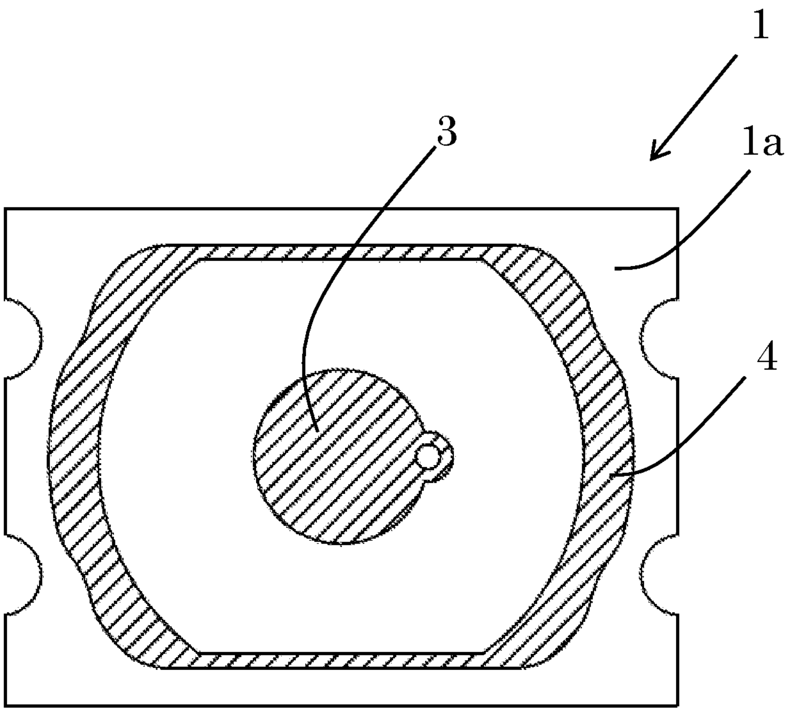
FIG. 5D shows a top plan view of a substrate of a push switch as an example, according to the fourth embodiment of the subject matter.

FIG. 5D shows a top plan view of a substrate of a push switch as an example, according to the fifth embodiment of the subject matter.

Figure 5E:
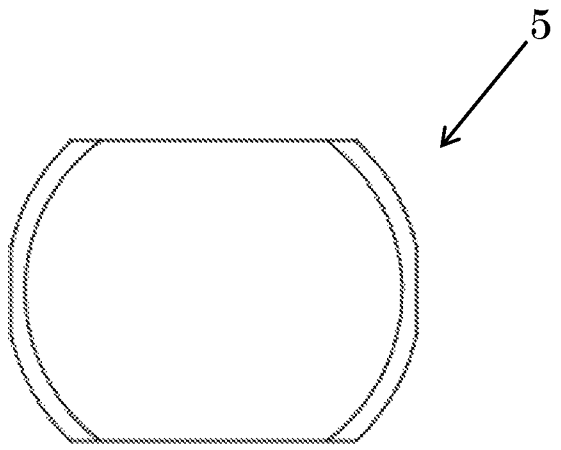
FIG. 5E shows a top plan view of a resilient member of a push switch as an example, according to the fifth embodiment of the subject matter.

FIG. 5E shows a top plan view of a resilient member of a push switch as an example, according to the fifth embodiment of the subject matter.

Figure 5F:
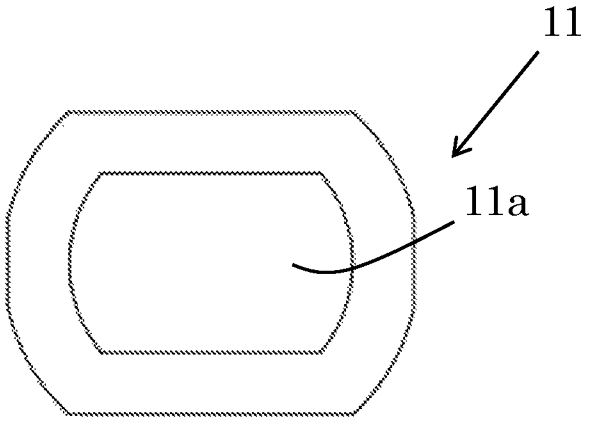
FIG. 5F shows a top plan view of a plate-shaped member of a push switch according to the fifth embodiment of the subject matter.

FIG. 5F shows a top plan view of a plate-shaped member of a push switch according to the fifth embodiment of the subject matter.

A push switch 500 includes a substrate 1 including a first electrode 3 that is arranged on an upper surface 1*a* of the substrate 1, and a second electrode 4 that is arranged on an upper surface 1*a* of the substrate 1 around the first electrode 3. The push switch 400 further includes a resilient member 5 that is arranged on the first electrode 3 of the substrate 1. The resilient member 5 includes an inverted-dome shape that is positioned on the first electrode 3 of the substrate 1. The push switch 400 further includes a plate-shaped member 11 including an opening 11*a* arranged above the resilient member 5. The plate-shaped member 11 may be higher in rigidity than the resilient member 5. The plate-shaped member 11 may be an annular plate-shaped member.

When the push switch 500 is pressed down from above, a peripheral portion 5*c* of the inverted-dome shape of the resilient member 5 is pressed down by the plate-shaped resilient member 11 that includes an annular shape to be in contact with the second electrode 4. Accordingly, the first electrode 3 and the second electrode 4 of the substrate 1 are electrically connected.

When a push switch is pressed down, a resilient member 5 made of metal at the dome shape collides with a first electrode of a substrate and causes a collision noise. However, if the resilient member 5 including an inverted-dome shape is arranged on the first electrode, the resilient member 5 is in contact with the second electrode at a peripheral portion of the inverted-dome shape. Accordingly, the noise caused by the collision of the resilient member 5 and the electrode may be diminished.

Figure 6A:
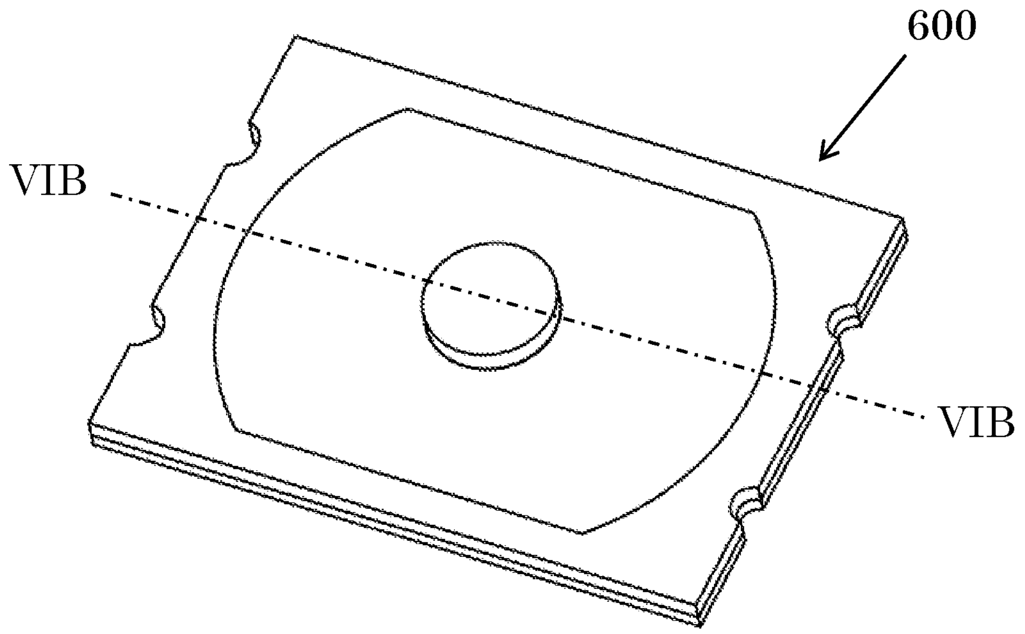
FIG. 6A shows a top perspective view of a push switch according to a sixth embodiment of the subject matter.

FIG. 6A shows a top perspective view of a push switch according to a sixth embodiment of the subject matter.

Figure 6B:
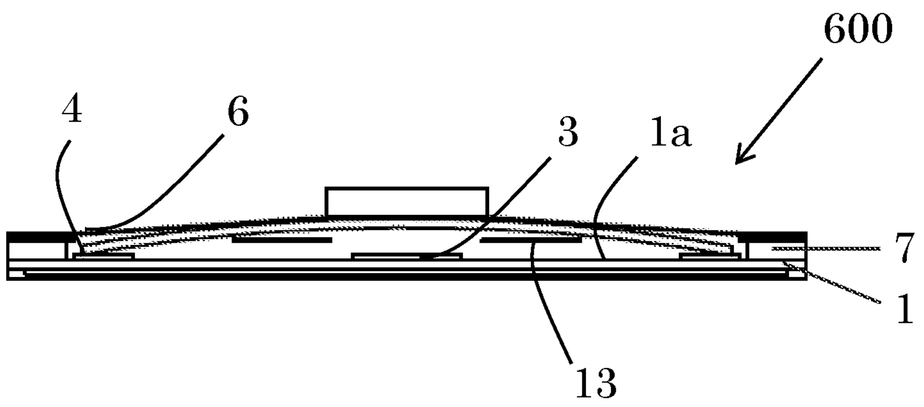
FIG. 6B shows a cross-sectional view of a push switch taken along a dotted line VIB-VIB shown in FIG. 6A.

FIG. 6B shows a cross-sectional view of a push switch taken along a dotted line VIB-VIB shown in FIG. 6A.

Figure 6C:
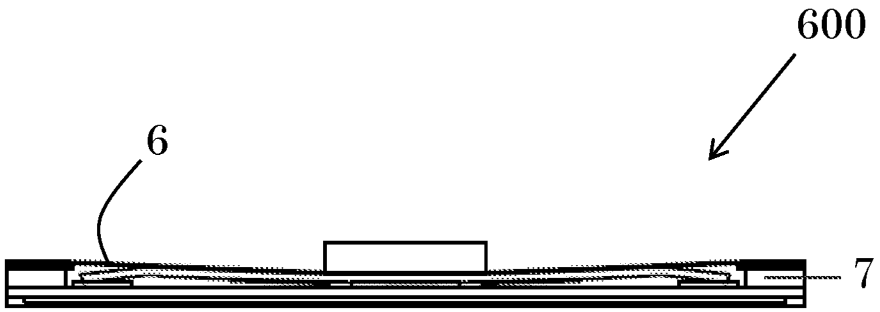
FIG. 6C shows a cross-sectional view of a push switch when a pressing force is applied from above the push switch shown in FIG. 6B.

FIG. 6C shows a cross-sectional view of a push switch when a pressing force is applied from above the switch shown in FIG. 6B.

Figure 6D:
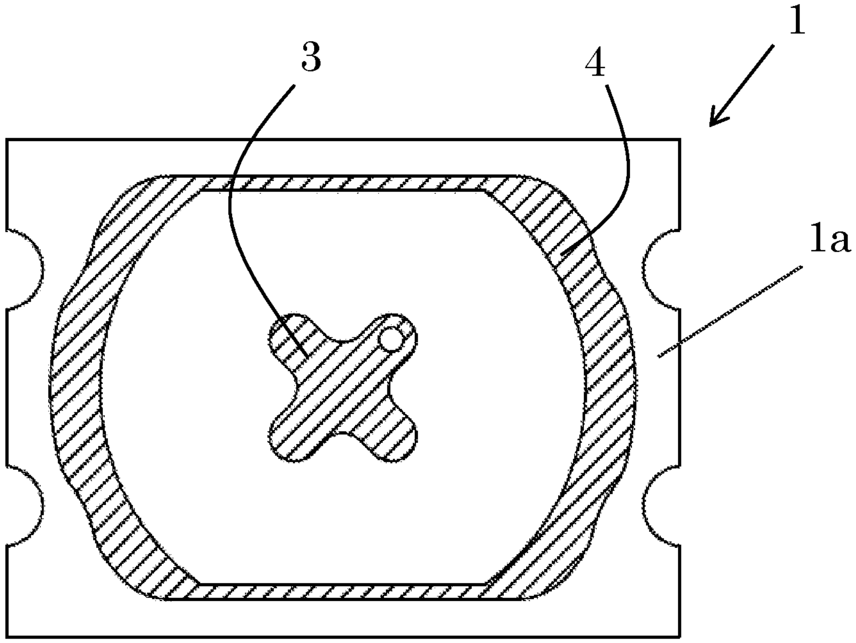
FIG. 6D shows a top plan view of a substrate of a push switch as an example, according to the sixth embodiment of the subject matter.

FIG. 6D shows a top plan view of a substrate of a push switch as an example, according to the sixth embodiment of the subject matter.

Figure 6E:
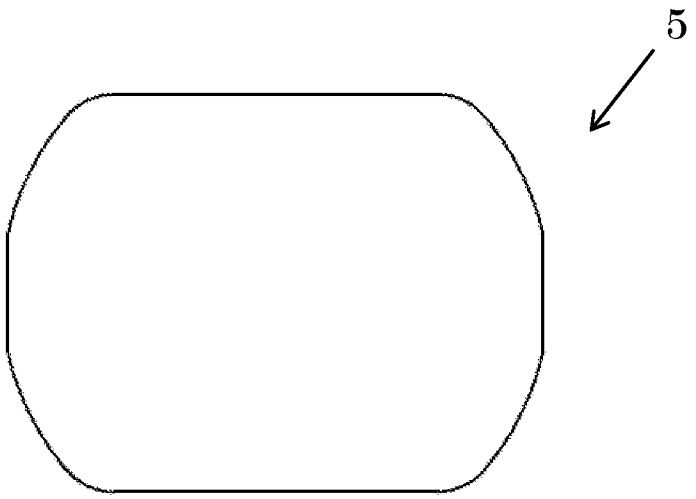
FIG. 6E shows a top plan view of a resilient member of a push switch as an example, according to the sixth embodiment of the subject matter.

FIG. 6E shows a top plan view of a resilient member of a push switch as an example, according to the sixth embodiment of the subject matter.

A push switch 600 includes a substrate 1. The substrate 1 includes a first electrode 3 arranged on the upper surface 1*a* of the substrate 1 and a second electrode 4 arranged on the upper surface 1*a* of the substrate 1 around the first electrode 3. The push switch 600 further includes a resilient member 5 that is arranged on the second electrode 4 over the first electrode 3 of the substrate 1, and a sheet 13 that is arranged between the upper surface 1*a* of the substrate 1 and the resilient member 5, the sheet 13 comprising a hole that is positioned above the first electrode 3.

Various electronic devices include push switches. An electronic device includes the push switch according to an embodiment of the subject matter, and a motherboard includes a first electrode and a second electrode. The push switch may be electrically connected to the first electrode and the second electrode of the motherboard of the electronic device.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A push switch comprising:

a substrate comprising:

a first electrode and a second electrode arranged on an upper surface of the substrate, the first electrode being arranged at a center of the upper surface of the substrate, and the second electrode being arranged around the first electrode, and a recess in a center of a lower surface of the substrate, the recess being positioned under the first electrode so as to overlap the first electrode in a plan view, and the recess not passing through the substrate;

a resilient member being arranged on the second electrode and over the first electrode, the resilient member including a dome shape that bulges at a center of the resilient member; and a sheet arranged over the resilient member and including a projection arranged on a surface of the sheet, wherein the recess has a center point that is aligned with a center point of the dome shape of the resilient member and a center point of the projection in the plan view.

2. The push switch according to claim 1, wherein the substrate further comprises a groove that is positioned in the lower surface of the substrate around the recess.

3. The push switch according to claim 1, wherein the recess has a square shape in the plan view.

4. The push switch according to claim 1, wherein the recess has a circular shape in the plan view.

5. The push switch according to claim 2, wherein the recess has a square shape in the plan view.

6. The push switch according to claim 5, wherein the groove has a square outline shape that is positioned around the recess in the plan view.

7. The push switch according to claim 2, wherein the recess has a circular shape in the plan view.

8. The push switch according to claim 7, wherein the groove has an annular shape that is positioned around the recess in the plan view.

9. An electronic device comprising:

the push switch according to claim 1; and a motherboard comprising a first electrode and a second electrode, wherein the push switch is electrically connected to the first electrode and the second electrode of the motherboard.

10. The push switch according to claim 1, wherein the recess has a bottom surface located on a side of the substrate opposite to the upper surface of the substrate.

11. A push switch comprising:

a substrate comprising:

a first electrode and a second electrode arranged on an upper surface of the substrate, the first electrode being arranged at a center of the upper surface of the substrate, and the second electrode being arranged around the first electrode, and a recess in a center of a lower surface of the substrate, the recess being positioned directly under the first electrode, and the recess not passing through the substrate;

a resilient member being arranged on the second electrode and over the first electrode, the resilient member including a dome shape that bulges at a center of the resilient member; and a sheet arranged over the resilient member and including a projection arranged on a surface of the sheet, wherein the recess has a center point that is aligned with a center point of the dome shape of the resilient member and a center point of the projection in a plan view.

12. The push switch according to claim 11, wherein the substrate further comprises a groove that is positioned in the lower surface of the substrate around the recess.

13. The push switch according to claim 11, wherein the recess has a square shape in the plan view.

14. The push switch according to claim 11, wherein the recess has a circular shape in the plan view.

15. The push switch according to claim 12, wherein the recess has a square shape in the plan view.

16. The push switch according to claim 15, wherein the groove has a square outline shape that is positioned around the recess in the plan view.

17. The push switch according to claim 12, wherein the recess has a circular shape in the plan view.

18. The push switch according to claim 17, wherein the groove has an annular shape that is positioned around the recess in the plan view.

19. An electronic device comprising:

the push switch according to claim 11; and a motherboard comprising a first electrode and a second electrode, wherein the push switch is electrically connected to the first electrode and the second electrode of the motherboard.

20. The push switch according to claim 11, wherein the recess has a bottom surface located on a side of the substrate opposite to the upper surface of the substrate.

* * * * *